(12) United States Patent
Hautson

(10) Patent No.: US 10,585,166 B2
(45) Date of Patent: Mar. 10, 2020

(54) METHOD OF TRACKING A POSITION OF A MAGNET BY DIFFERENTIAL MEASUREMENT

(71) Applicant: ISKN, Saint-Martin-d'Hères (FR)

(72) Inventor: Tristan Hautson, Fontaine (FR)

(73) Assignee: ISKN, Saint-Martin-d'Heres (FR)

( * ) Notice: Subject to any disclaimer, the term of this patent is extended or adjusted under 35 U.S.C. 154(b) by 13 days.

(21) Appl. No.: 15/766,443

(22) PCT Filed: Oct. 7, 2016

(86) PCT No.: PCT/FR2016/052591
§ 371 (c)(1),
(2) Date: Apr. 6, 2018

(87) PCT Pub. No.: WO2017/060644
PCT Pub. Date: Apr. 13, 2017

(65) Prior Publication Data
US 2018/0313933 A1    Nov. 1, 2018

(30) Foreign Application Priority Data
Oct. 9, 2015   (FR) ...................... 15 59642

(51) Int. Cl.
*G01S 5/16* (2006.01)
*G06F 3/046* (2006.01)
*G01R 33/02* (2006.01)

(52) U.S. Cl.
CPC ................ *G01S 5/16* (2013.01); *G06F 3/046* (2013.01); *G01R 33/0206* (2013.01)

(58) Field of Classification Search
None
See application file for complete search history.

(56) References Cited

U.S. PATENT DOCUMENTS

2011/0025313 A1* 2/2011 Zangl ................... G01D 5/145
324/207.25

FOREIGN PATENT DOCUMENTS

WO    WO2009/007210    1/2009
WO    WO2013/144337    10/2013

* cited by examiner

*Primary Examiner* — Clayton E. LaBalle
*Assistant Examiner* — Jas A Sanghera
(74) *Attorney, Agent, or Firm* — Occhiuti & Rohlicek LLP

(57) ABSTRACT

The invention is a method for tracking a position of a magnet moving relative to a magnetometer array. On the basis of the magnetic field detected by each magnetometer of the array, the position of the magnet is estimated. This estimation is based on taking into account a reference magnetic field established beforehand, this reference magnetic field being subtracted from the magnetic field detected by each magnetometer, so as to form a differential measurement. The various successive estimations of the position of the magnet allow its path to be tracked.

20 Claims, 7 Drawing Sheets

METHOD OF TRACKING A POSITION OF A MAGNET BY DIFFERENTIAL MEASUREMENT

CROSS REFERENCE TO RELATED APPLICATION

This application is the national phase under 35 USC 371 of international application no. PCT/FR2016/052591, filed Oct. 7, 2016, which claims the benefit of the Oct. 9, 2015 priority date of French application no. 1559642.

TECHNICAL FIELD

The invention relates to a device for tracking a position of a magnet, relative to a plurality of magnetometers, by estimating the positions successively occupied by the magnet with respect to this array. One possible application is the transfer, to a screen, or to a computer file, of said position.

PRIOR ART

A method for determining the position and orientation of a magnet with respect to a magnetometer array has been described in patent application WO2013144337. In this document, it is explained how, on the basis of a plurality of measurements of a magnetic field induced by the magnet, it is possible to determine the position and orientation of the latter. More precisely, a device including a magnetometer array, the position of which is known, is employed. Each magnetometer is able to measure a component of a magnetic field generated by the magnet, along at least one measurement axis. The combination of various measurements, taken by various magnetometers, allows the position, and optionally the orientation, of the magnet, with respect to the magnetometer array, to be determined.

One possible application of this method is a magnetic slate, in which the magnetometers are arranged in a substantially planar array parallel to a bearing surface of the slate. A user may then move a pencil, including a magnet, so as to form an inscription on a writing medium, for example a paper medium, the latter being placed against said bearing surface. The method then allows the path of the magnet to be tracked. Thus, the inscription formed by the user against the bearing surface may be recorded by the magnetic slate, then reported on a screen and/or stored in memory.

Document WO2009/007210 describes a method for determining an orientation of a magnet with respect to a magnetometer array. To do this, the magnetic field measured by each magnetometer is compared to a reference value, the latter corresponding to a measurement, or an estimation, of the magnetic field measured by the magnetometer when the magnet has a preset orientation. With each magnetometer, a reference value corresponding to various preset orientations of the magnet is determined. This method is simple to implement since it consists in simply comparing the magnetic field measured by each magnetometer and the reference values determined beforehand. However, the orientations measured by the method can only correspond to one of said preset orientations.

The inventors have sought to improve the method described in WO2013144337. Specifically, this method assumes that an initialization is carried out, in which, for each magnetometer, the measurement of the magnetic field produced by the magnet must be negligible. Thus, during this initialization, each magnetometer measures an ambient signal, corresponding substantially to the ambient magnetic field of the environment in which the device is placed. The measurement of each magnetometer is also assigned an offset signal that is specific to the sensor. This signal may be due to sensor magnetization effects, or to the fluctuation of certain components, magnetoresistors for example. During the implementation of the method, an ambient signal and an offset signal, which are determined at an initial time, are subtracted from the measurements carried out by each magnetometer. However, the offset signal and, to a lesser extent, the ambient signal, may fluctuate over time, this leading to a drift in the signal measured by each magnetometer. An uncontrolled bias in the measurement of the magnetic field generated by the magnet results, this possibly leading to an error in the estimation of the position of the magnet.

In addition, the initialization process may be constraining, because it requires the magnet to be placed at a sufficient distance from the magnetometer array, such that the magnetic field that it produces does not influence the measurements of the magnetometers. For example, a magnet the magnetic moment of which is equal to 0.2 $A.m^2$ must be placed at a distance of about 30 cm from the magnetometers, such that the magnetic field produced by the magnet at the magnetometers is negligible with respect to the ambient magnetic field.

The invention allows these drawbacks to be solved while allowing the position of the magnet to be determined with greater precision, and allows the method to be reinitialized more regularly or even a plurality of initializations to be considered simultaneously.

SUMMARY OF THE INVENTION

A first subject of the invention is a method for estimating the position of a magnet, said magnet being moved relative to a magnetometer array comprising a plurality of magnetometers, each magnetometer being able to measure a magnetic field generated by said magnet along at least one measurement axis, the method including the following steps:
 a) measuring, with each magnetometer, a reference magnetic field at a reference time;
 b) assigning a reference position to the magnet at said reference time;
 c) measuring a magnetic field generated by said magnet with each magnetometer, at a measurement time subsequent to the reference time;
 d) calculating a differential magnetic field representing a difference, for each magnetometer, between the magnetic field measured in step c) and the reference magnetic field measured in step a);
 e) on the basis of each differential magnetic field and of an estimation of said reference position, estimating a position of said magnet at said measurement time; and
 f) reiterating steps c) to e) on the basis of the estimation obtained in step e), while incrementing the measurement time.

In the first iteration, the reference position may in particular be the reference position that was assigned to the magnet at the reference time. It is either known, or determined arbitrarily.

The method may include, in step e), estimating the position of the magnet on the basis:
 of an estimation of the position of the magnet at a time preceding the measurement time;
 of an estimation of the reference position, said estimation being carried out at a time preceding the measurement time;

step e) also comprising estimating the reference position, at said measurement time.

The method may include, following step e), a step e') of validating the respective estimations of the position of the magnet at the measurement time and of the reference position, this step including the following substeps:
i) determining a movement of the magnet between the measurement time and the reference time, a position of each magnetometer being weighted, at each of these times, by a weighting factor that is dependent on the modulus of the magnetic field measured by said magnetometer at said time;
ii) comparing the movement determined in substep i) with a movement calculated using the estimations, at the measurement time, of the position of the magnet and of the reference position.

Substep i) may comprise:
determining, for each magnetometer, a differential magnetic field that is what is called the instantaneous differential magnetic field, which represents a variation between the magnetic field measured at a first time and the magnetic field measured at a second time, said second time neighboring said first time, said determination being carried out by considering, in succession, a first time corresponding to the measurement time and to the reference time, so as to obtain an instantaneous differential magnetic field at each of these times,
said determination of each weighting factor, at the measurement time and at the reference time being carried out, respectively, on the basis of the modulus of the instantaneous differential magnetic field at the measurement time and at the reference time, respectively.

According to one embodiment:
steps a) and b) are repeated, such that a plurality of reference positions are obtained, each reference position being associated with:
  a reference time;
  the position assigned to the magnet at said reference time; and
  the magnetic field measured by each magnetometer at said reference time, and
step d) includes calculating at least one differential magnetic field from at least one reference magnetic field.

According to this embodiment:
each reference position may be associated with a validity indicator, whether or not said reference position is taken into account, at each measurement time, in steps d) and e), depending on said validity indicator;
steps a) and b) may be repeated when the number of reference positions is smaller than a preset number of reference positions;
step d) may comprise calculating a plurality of differential magnetic fields that each represent a difference, for each magnetometer, between the magnetic field measured in step c) and each reference magnetic field.

Step e) may then comprise a plurality of estimations, called intermediate estimations, of the position of said magnet at said measurement time, each intermediate estimation being based on a reference position that differs from one to the next, the position of the magnet at said measurement time being determined depending on these intermediate estimations. It may also comprise updating the estimation of each reference position at each measurement time. The position of the magnet at the measurement time may then be estimated:

from an optionally weighted average of said intermediate estimations;
by considering the reference position that is the furthest away or a reference position located beyond a preset distance from the plurality of intermediate estimations;
on the basis of a reference position that is selected depending on the validity indicator that is associated therewith;
by considering each reference position of said plurality of reference positions in succession.

The method may include one of the following features, alone or in any technically producible combination:
in step b), either an arbitrary position, or an estimation of the position of the magnet at the reference time, is assigned to said reference position;
step e) includes, apart from an estimation of the position of the magnet at each measurement time, an estimation of the orientation of the magnet at this time;
step e) also includes an estimation of components of a magnetic moment of the magnet at the measurement time. Conditions may placed on these components, such that the modulus of the magnetic field of the magnet corresponds to a preset value or a range of values.

According to one embodiment, step e) includes determining a state vector relating to the measurement time, this state vector being determined depending on said state vector at a time preceding the measurement time: this preceding time may be a reference time, or a measurement time corresponding to a preceding iteration, and in particular the preceding iteration. This state vector may in particular include: the position of the magnet at the measurement time, an estimation, at the measurement time, of at least one reference position of the magnet, and optionally an estimation of the magnetic moment of the magnet at the measurement time and at the reference time. This state vector may be brought up to date on each iteration of steps c), d) and e), step e) then possibly including:
a substep of estimating the state vector at the measurement time, on the basis of a state vector relating to a time preceding the measurement time, and for example the time corresponding to the preceding iteration; and
a substep of updating the state vector at the measurement time, on the basis of the differential magnetic field determined in step d).

According to one embodiment, which is compatible with the embodiments described above:
step d) comprises determining, at the measurement time, an average differential magnetic field, which represents a difference between an average of the magnetic fields measured by each magnetometer at the measurement time and the reference time, respectively;
step e) comprises taking into account the average differential magnetic field thus established, the terms of which are subtracted from the differential magnetic field.

Step e) may then comprise:
estimating the differential magnetic field measured, at the measurement time, by each magnetometer, and determining an average of said estimations;
taking into account the average of the estimations of each differential magnetic field measured by each magnetometer, the terms of which are subtracted from the estimation of the differential magnetic field measured, at the measurement time, by each magnetometer.

According to one embodiment, when a plurality of references are used, a reference position that is what is called a fused reference position is established. The determination of this fused reference position comprises the following steps:

- on the basis of the estimation, at a measurement time, of a first reference position, determining a magnetic field produced by the magnet at the reference time associated with said first reference position and determining an ambient magnetic field at this reference time;
- on the basis of the estimation, at said measurement time, of a second reference position, determining a magnetic field produced by the magnet at the reference time associated with said second reference position and determining an ambient magnetic field at this reference time;
- establishing a new reference position, by combining said ambient magnetic fields thus established, this reference position possibly being assigned to a position at infinity, or assigned a zero reference magnetic moment.

According to this embodiment, a plurality of reference positions may then be fused, by estimating as many ambient magnetic fields at each reference time associated with a reference position.

Whatever the embodiment, step e) may be carried out using a recursive estimator, for example a Kalman filter or an extended Kalman filter.

Another subject of the invention is a device for locating a movable magnet, the magnet being able to be moved relative to a magnetometer array, each magnetometer being able to deliver, at various measurement times, a measurement of a magnetic field produced by said magnet along at least one measurement axis, the device including a processor configured to receive, at each measurement time, the measurements delivered by each magnetometer, and to implement the method described in this patent application, so as to determine a position of the magnet at each measurement time.

Another subject of the invention is a data storage medium containing instructions for executing a method described in this patent application, these instructions being able to be executed by a microprocessor.

The invention will be better understood on reading the following description, which is given by way of nonlimiting example and with reference to the figures, which are presented below.

FIGURES

In these figures, the same references will be used to reference elements that are the same.

DESCRIPTION OF PARTICULAR EMBODIMENTS

Figure 1A:
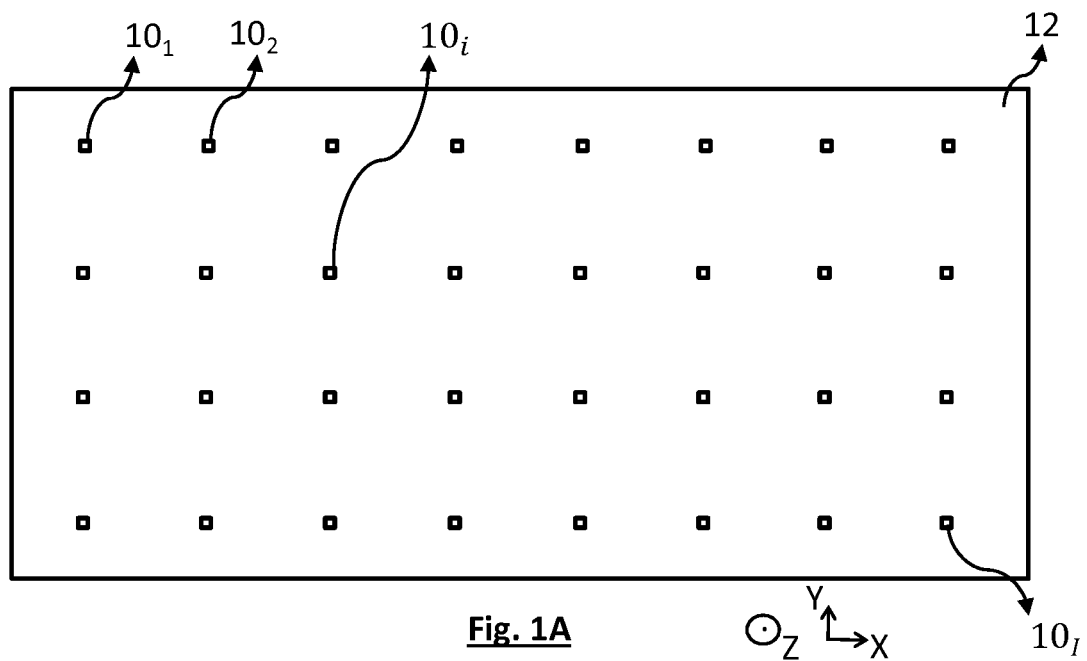
FIG. 1A shows a holder comprising magnetometers forming an array.

FIG. 1A shows a holder 12 including an array of magnetometers $10_1, 10_2 \ldots 10i \ldots 10I$. Each magnetometer is here arranged in a matrix array. Each magnetometer is referenced by the index i, such that $1 \le i \le I$. The array includes I magnetometers, with, in this case, I=32. In this example, the magnetometers are coplanar, or substantially coplanar, in a plane defined by axes X and Y. Each magnetometer $10i$ is able to measure a magnetic field $B_i$ to which it is exposed, and in particular a component of this magnetic field along at least one measurement axis $x_i, y_i, z_i$. In this figure, the axes X, Y, Z of a frame of reference R associated with the holder 12 have been shown. Preferably, each magnetometer is a triaxial magnetometer. In this case, the measurement axes $x_i, y_i, z_i$ of each magnetometer $10_i$ may be coincident with the measurement axes of the frame of reference R. The holder 12 is, in this example, a rigid holder, to which the magnetometers are fastened. It may in particular be a question of a printed circuit board (PCB). In this example, the magnetometers are fastened in place with respect to one another, this being a preferred configuration.

Figure 1B:
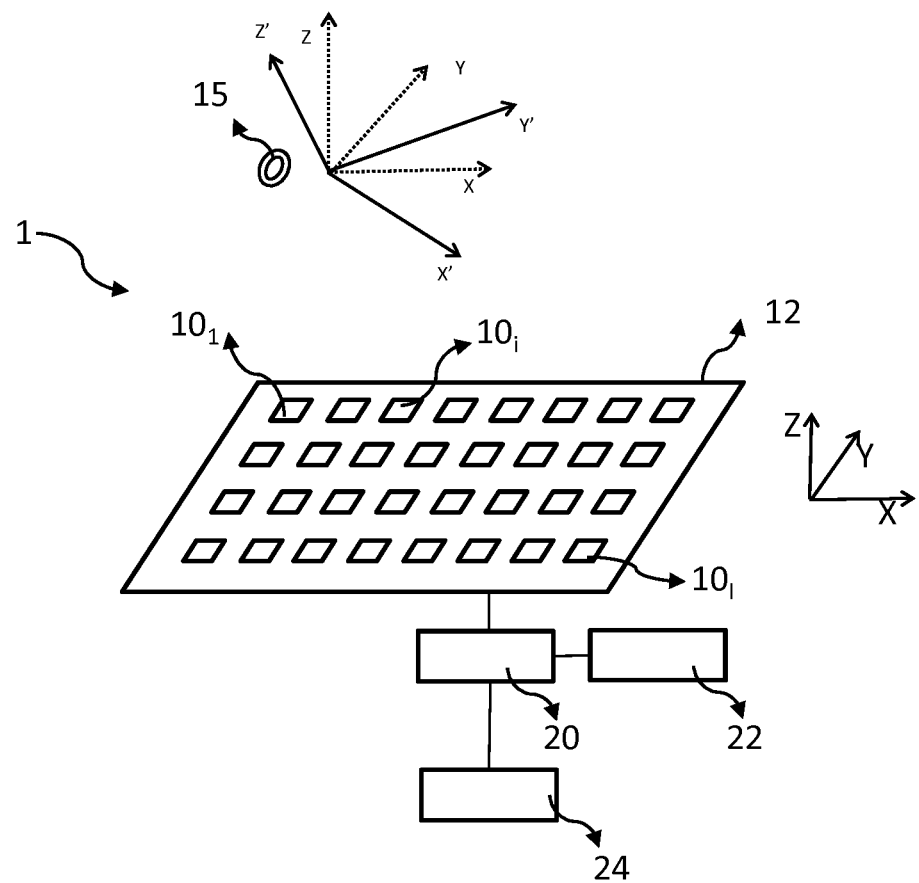
FIG. 1B shows a perspective view of this holder, and a magnet the position and optionally the orientation of which it is sought to determine with respect to the magnetometer array.

FIG. 1B shows a device according to the invention, including the holder 12, described with reference to FIG. 1A, the latter being connected to a processor 20, for example a microprocessor. The processor 20 is connected to a memory 22 containing instructions, the latter being executable by the processor 20 in order to implement the method described below. These instructions may be saved to a storage medium that is readable by the processor, such as a hard disk, CD-ROM or another type of memory. The processor may be connected to a display unit 24, for example a screen.

FIG. 1B also shows a magnet 15 that is able to be moved relative to the magnetometers. This magnet is associated with a frame of reference, called the frame of reference of the magnet, R', the axes X', Y' and Z' of which are shown in FIG. 1B. This frame of reference is movable with respect to the frame of reference of the holder R. The dipolar magnetic moment m generated by the magnet may be oriented, with respect to the frame of reference R, using the Euler angles Ψ (precession), θ (nutation) and φ (intrinsic rotation) that are associated with passage from the frame of reference R, i.e. the frame of reference defined by the axes XYZ, to the frame of reference R', i.e. the frame of reference defined by the axes X', Y' and Z'.

The magnet 15 may be a permanent magnet, an electromagnet or a ferromagnetic material having a remnant field. Its magnetic moment is for example comprised between 0.01 A.m² and 1 A.m². It is preferably fastened, via a rigid link, to a pencil, such that the device is able to detect the movements of the pencil with respect to the magnetometer array. The magnetic field produced by this magnet, at a plurality of magnetometers, is preferably higher than 100 $A.m^{-1}$ or 500 $A.m^{-1}$ such that the magnet may be "seen", i.e. detected, by said magnetometers. A person skilled in the art will be able to set the specifications of the magnet, and the magnetometers, such that the magnetic field produced by the magnet is detectable by each magnetometer when the magnet is distant by at least 5 cm or 10 cm from the holder.

In one application, a writing medium is placed on a bearing surface, which is placed between the magnetometers 12 and the pencil. The paper may in particular bear against the bearing surface, such that the device is able to record an inscription formed by the pencil on said paper, just as with the device described in WO2013144337, which was referred to in the description of the prior art. The writing medium may be a piece of paper, a piece of cardboard or a piece of cloth. The writing medium is then sufficiently thin that the magnetic field generated by the magnet can be detected by a plurality of magnetometers forming the array. A user may then move the pencil and produce an inscription on the paper, the movement of the magnet then being tracked by the processor 20, so as to store the inscription in the memory 22 and/or display it on the screen 24.

Figure 2A:
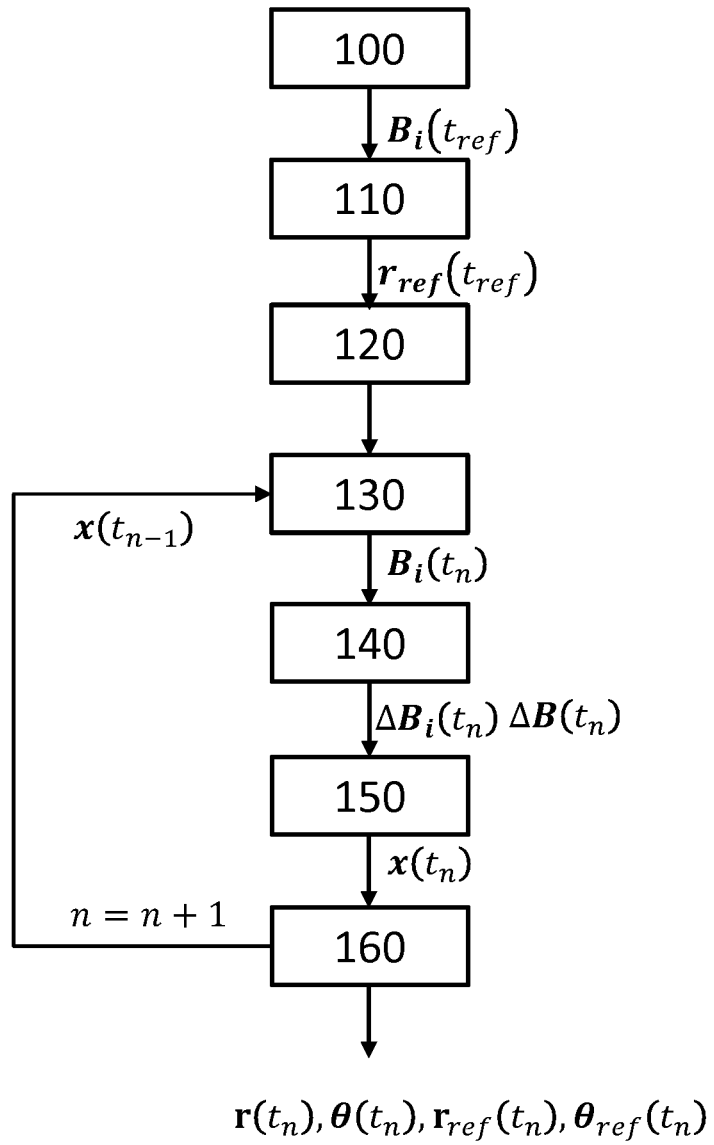
FIG. 2A shows the main steps of an embodiment of the invention.

The main steps of a method that may be implemented in order to detect the position of the magnet as a function of time, so as to establish a path thereof in the frame of reference of the holder R will now be described with reference to FIG. 2A. As mentioned above, the method may be implemented by the processor 20, the latter receiving the data measured by the magnetometers $10_i$ of the array. The successive positions of the magnet are then stored in the memory 22 and/or reported on the display screen 24.

Each magnetometer is configured to measure, along at least one measurement axis $x_i$, $y_i$, $z_i$, a magnetic field $B_i$ to which it is subjected. This magnetic field is a sum of a useful magnetic field $B_i^{15}$, generated by the magnet 15, and an ambient magnetic field, denoted $B^{env}$, due to the magnetic environment in which the device is placed, and a drift in the response of the magnetometer, forming an offset signal denoted $B_i^{offset}$. The offset signal depends on each magnetometer, whereas the ambient magnetic field is considered to be identical for all the magnetometers. In other words, $B_i = B_i^{15} + B^{env} + B_i^{offset}$.

Step 100:
measurement of a reference field. In this step, each magnetometer $10_i$ measures a magnetic field $B_i(t_{ref})$ called the reference magnetic field. This measurement is carried out at a reference time $t_{ref}$. Unlike in the prior art, the magnet 15 may be placed in a reference position such that it produces a magnetic field that is significant for at least one magnetometer, and preferably for all of the magnetometers. Moreover, at said reference time, the magnetic moment called the reference magnetic moment of the magnet is denoted $m_{ref}(t_{ref})$.

Step 110:
assignment of a reference position. In this step, a reference position denoted $r_{ref}(t_{ref})$, that corresponds to the coordinates of the magnet 15 in the frame of reference R is assigned. When no a priori as regards this reference position is available, it may be defined arbitrarily, for example to a preset position.

Step 120:
incrementation of the time. The time being discretized into sampling time periods, step 120 consists in incrementing the time with respect to the reference time $t_{ref}$ considered in steps 100 to 110.

The following steps are carried out iteratively, each iteration of rank n being associated with a time $t_n$ called the measurement time or current time.

Step 130:
measurement of the magnetic field $B_i(t_n)$, at the current time $t_n$, with each magnetometer $10_i$.

Step 140:
differential measurement: for each magnetometer $10_i$, calculating a differential magnetic field $\Delta B_i(t_n)$, which represents a difference between the magnetic field $B_i(t_n)$ measured in step 130 and the reference magnetic field $B_i(t_{ref})$ measured in step 100. For each magnetometer, the difference is calculated by subtracting, axis by axis, components of the magnetic field at the current time and at the reference time. A vector of differential measurements $\Delta B(t_n)$, comprising all of the differential magnetic fields $\Delta B_i(t_n)$ of the magnetometers in question, is thus formed. In this example, in which the array contains 32 triaxial magnetometers, the vector $\Delta B(t_n)$ contains 96 terms, each term representing a measurement, along one axis, of the differential magnetic field taken by a magnetometer $10_i$. The advantage of differential measurements is that they make it possible to exclude the ambient magnetic field and the offset signal of each magnetometer $10_i$. Specifically:

$$\Delta B_i(t_n) = B_i(t_n) - B_i(t_{ref})$$

$$= B_i^{15}(t_n) + B^{env}(t_n) + B_i^{offset}(t_n) - B_i^{15}(t_{ref}) - B^{env}(t_{ref}) -$$

$$B_i^{offset}(t_{ref}).$$

Provided that the reference time $t_{ref}$ and the measurement of the magnetic field $B_i(t_{ref})$ at this time are renewed regularly, it may be considered to be true that $B^{env}(t_n) \approx B^{env}(t_{ref})$ and that $B_i^{15}(t_n) \approx B_i^{offset}(t_{ref})$. Thus, the differential measurement $\Delta B_i(t_n)$ is independent of the ambient magnetic field and the offset signal of each detector. The renewal of the reference time will be described below.

Step 150:
estimation of the position of the magnet at the current time.

Generally, a state vector $x(t_n)$, comprising an estimation of the position of the magnet $r(t_n)$ at the current time $t_n$, is determined in this step, this estimation being carried out depending on the state vector $x(t_{n-1})$ estimated in the preceding iteration. In the first iteration, the estimation is carried out depending on an initialized state vector. The estimation is carried out by implementing a recursive estimator of the extended-Kalman-filter type. The state vector $x(t_n)$ includes:

an estimation of the position $r(t_n)$ of the magnet at the current time $t_n$, and an estimation of its magnetic moment $m(t_n)$, on the basis of which it is possible to determine the orientation $\theta(t_n)$ of the magnet;

an estimation of the reference position of the magnet $r_{ref}(t_n)$ at the current time $t_n$, and an estimation of the reference magnetic moment $m_{ref}(t_n)$, on the basis of which it is possible to determine the orientation of the magnet at the reference time $\theta_{ref}(t_n)$. In the first iteration, the reference position $r_{ref}(t_{ref})$ of the magnet corresponds to a position assigned to the magnet at the reference time: it is either known, or determined arbitrarily.

In this example, the state vector includes the estimations:
of the coordinates of the magnet, at the current time $t_n$ and at the reference time $t_{ref}$, along each axis X, Y, Z of the frame of reference R associated with the holder;
components $m_x$, $m_y$, $m_z$, of the magnetic moment of the magnet along the respective axes X, Y, Z of the frame of reference R at each of these times.

The state vector $x(t_n)$ is therefore, in this example, a vector of dimension (12, 1).

Figure 2B:
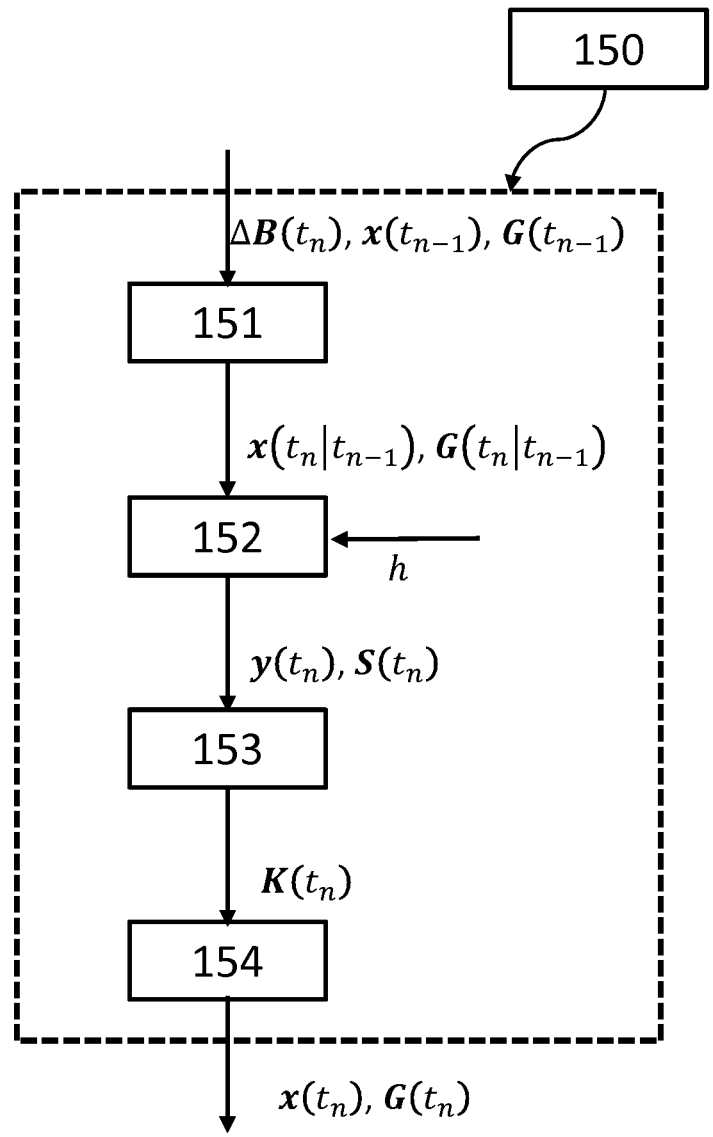
FIG. 2B shows the detail of one of the steps of FIG. 2A.

The substeps of this step 150 will now be described with reference to FIG. 2B, these substeps including a substep 151 of estimating the state vector, a substep 152 of calculating the innovation, a substep 153 of calculating the gain and a substep 154 of updating the state vector on the basis of the calculations of substeps 151 to 153.

Substep 151:

estimation. Knowing the state vector $x(t_{n-1})$ obtained in the preceding iteration, the state vector $x(t_n)$ is estimated, this estimation being denoted $x(t_n|t_{n-1})$, from the expression $$x(t_n|t_{n-1})=f(x(t_{n-1})) \quad (1).$$

In this example, $x(t_n|t_{n-1})=x(t_{n-1})$, i.e. the prediction function $f$ is the identity function. According to one variant, the prediction function takes into account one or more preceding positions, and an estimation of kinematic parameters relating to the movement and/or rotation of the magnet during preceding iterations: these kinematic parameters may be a velocity, an acceleration, an angular velocity, an angular acceleration.

In the first iteration, the estimation is based on an initial state vector determined depending on the position $r_{ref}(t_{ref})$ of the magnet at the reference time, and of the magnetic moment $m_{ref}$ at this time.

In step 151, a covariance matrix of the error $G(t_n|t_{n-1})$ is also estimated using the expression $$G(t_n|t_{n-1})=F(t_n)G(t_{n-1})F^T(t_n)+Q(t_n), \quad (2) \text{ where:}$$

$F(t_n)$ is a prediction matrix, relating the preceding state n-1 to the current state n. In this example, it is an identity matrix of 12×12 size;

T is the transposition operator;

$Q(t_n)$ is a noise covariance matrix of the process, of 12×12 size;

$G(t_{n-1})$ is the covariance matrix of the error. It results from the preceding iteration. In the first iteration (n=1), $G(t_{n-1})$ is initialized to a diagonal matrix.

Substep 152:

calculation of the innovation vector and of the covariance of the innovation vector. The innovation vector $y(t_n)$ is determined using the expression:

$$y(t_n)=\Delta B(t_n)-h(x(t_n|t_{n-1})) \quad (3), \text{ where}$$

$\Delta B(t_n)$ is the vector of differential measurements that was established in step 140, of 96×1 size;

h is a function representing the direct model, relating the terms of the state vector to the terms of the vector of differential measurements $\Delta B(t_n)$. $h(x(t_n|t_{n-1}))$ is a vector of 96×1 size. $h(x(t_n|t_{n-1}))$ represents an estimation of the differential magnetic field, for each magnetometer, at the time $t_n$. Each term of the vector $h(x(t_n|t_{n-1}))$ represents an estimation, along an axis, of the differential magnetic field at a magnetometer $10_i$. Just like the vector $\Delta B(t_n)$, the number of terms of this vector is equal to the number of magnetometers $10_i$ in question multiplied by the number of measurement axes of each magnetometer.

Thus, the method includes a comparison between measurements, in the present case the vector $\Delta B(t_n)$, and an estimation of these measurements, taking the form of the vector $h(x(t_n|t_{n-1}))$. This comparison in particular takes the form of a subtraction.

The covariance of the innovation vector $S(t_n)$ is obtained using the expression:

$$S(t_n)=H(t_n)G(t_n|t_{n-1})H^T(t_n)+R(t_n) \quad (4), \text{ where}$$

$H(t_n)$ is a matrix relating the measurements to the state vector, each term $H_{u,v}(t_n)$ of this matrix being such that $$H_{u,v} = \frac{\partial \Delta B_u}{\partial x_v}$$

where u is the index of the terms of the vector $\Delta B(t_n)$ (in this example, $1 \le u \le 96$) and v is the index of the terms of the state vector $x(t_n)$, (in this example, $1 \le v \le 12$). $H(t_n)$ is a matrix of 96×12 size.

$R(t_n)$ is a covariance matrix of the noise of the measurements, of 96×96 size.

When the state vector includes an estimation of the components of the magnetic moment of the magnet, this step may include using conditions on an estimation of the modulus of this magnetic field with respect to a known value of this modulus. In other words, conditions are placed on said components of the magnetic moment of the magnet, such that the modulus of the magnetic field of the magnet corresponds to a preset value or range of values. This allows the number of unknowns to be decreased.

Substep 153 calculation of the gain. The gain of the Kalman filter is a matrix $K(t_n)$, of 12×96 size, such that:

$$K(t_n)=G(t_n|t_{n-1})H^T(t_n)S^{-1}(t_n) \quad (5).$$

Substep 154 update of the state vector. The state vector $x(t_n)$ is updated, on the basis of the prediction $x(t_n|t_{n-1})$, of the innovation $y(t_n)$ and of the gain $K(t_n)$ using the expression:

$$x(t_n)=x(t_n|t_{n-1})+K(t_n)y(t_n) \quad (6).$$

This step also includes updating the covariance matrix of the error using the expression:

$$G(t_n)=(I-K(t_n)H(t_n))G(t_n|t_{n-1}) \quad (7), \text{ where I is the identity matrix.}$$

The state vector $x(t_n)$ thus determined includes:

an estimation of the position $r(t_n)$ of the magnet and of the magnetic moment $m(t_n)$ at the current time $(t_n)$, on the basis of which it is possible to determine an orientation $\theta$ of the magnet, i.e. one or more angles of inclination, for example the angles $\theta_x$, $\theta_y$, $\theta_z$ mentioned above;

an estimation of the reference position $r_{ref}(t_n)$ of the magnet and of the reference magnetic moment $m_{ref}(t_n)$, (t) these estimations being updated at each current time $t_n$.

Over the course of the iterations, the estimation of the reference position of the magnet $r_{ref}$ is refined. Thus, it is not necessary for this position to be estimated with precision during the measurement of the reference magnetic field $B_i(t_{ref})$.

Step 160:

reiteration. In step 160, the time is incremented by one unit $(t_n=t_{n+1})$ and the iterative process restarts from step 130, on the basis of the estimations of $x(t_{n-1})$ and $G(t_{n-1})$, which were estimated in substep 154.

Figure 3A:
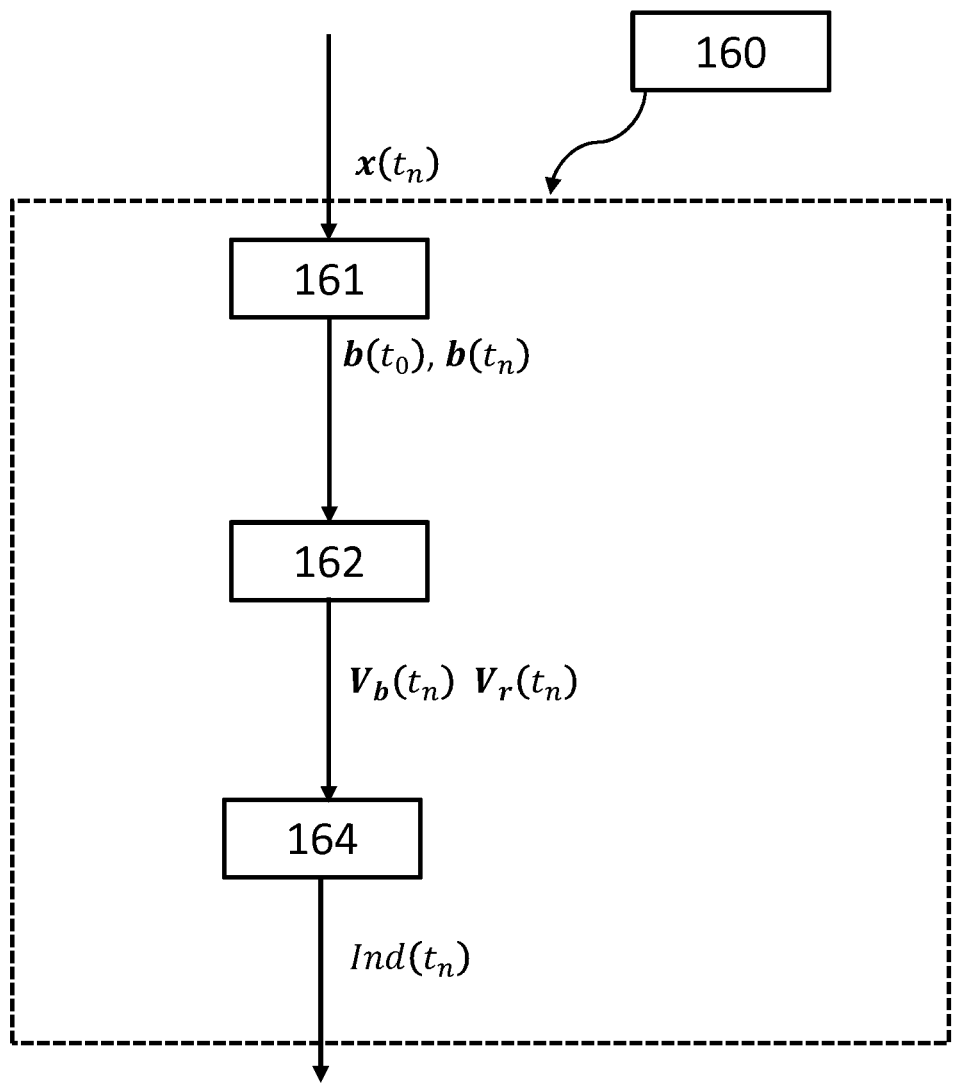
FIG. 3A shows the main steps of a variant of the embodiment shown in FIG. 2A.

Prior to the new iteration, the step 160 may comprise a step of validating the estimation of the position $r(t_n)$ of the magnet. This step then comprises 4 substeps 161 to 164, which are described below with reference to FIG. 3A.

Specifically, the algorithm for estimating the state vector $x(t_n)$ described above may converge to two symmetric configurations, in which configurations the estimations, at the current time $t_n$, of the location $r(t_n)$ of the magnet, and its magnetic moment $m(t_n)$, of the reference position $r_{ref}(t_n)$ and of the reference magnetic moment $m_{ref}(t_n)$ are respectively $r_1, m_1, r_2, m_2$ or $r_2, -m_2, r_1, -m_1$. This is related to the fact that the measurements processed by the iterative algorithm are differential measurements, and to the following property:

$$B_i(r_1,m_1)-B_i(r_2,m_2)=B_i(r_2,-m_2)-B_i(r_1,-m_1) \quad (8)$$

where $B_i(r_k,m_k)$ is the magnetic field measured by a magnetometer $10_i$ and produced by a magnet placed at a position $r_k$, and having a magnetic moment $m_k$.

Thus, the state vector $x(t_n)$ estimated at the current time $t_n$ may either indicate:
- a location of the magnet $r(t_n)=r_1$, its magnetic moment at this time being $m_1$ and the location and magnetic moment at the reference time being $r_2$ and $m_2$, respectively;
- or a location of the magnet $r(t_n)=r_2$, its magnetic moment at this time being $-m_2$ and the location and magnetic moment at the reference time being $r_1$ and $-m_1$, respectively.

This may lead to a confusion between the position of the magnet at the current time and the reference position. In order to validate the estimations given by the state vector $x(t_n)$, step 160 includes the following validation process:

Substep 161:
centroid estimations. This substep includes selecting a group of magnetometers $10_i$ and, on the basis of the differential magnetic field $\Delta B_i(t_n)$ measured at the time $t_n$ by each magnetometer of this group, this step also includes estimating what is called a centroid position $b(t_n)$ of the magnet in the frame of reference R at the measurement time using the expression:

$$b(t_n)=\Sigma_i k_i(t_n)r_i \quad (9), \text{ where:}$$

$k_i(t_n)$ is a weighting term assigned to the magnetometer $10_i$ at the time $t_n$. For example, $k_i(t_n)=\|\Delta B'_i(t_n)\|=\|B_i(t_n)-B_i(t_{n-q})\|$, where $B_i(t_{n-q})$ is the value of the magnetic field $B_i$ measured by the magnetometer $10_i$ at the time $t_{n-q}$. This time $t_{n-q}$ is a time neighboring the time $t_n$. By neighboring, what is meant is that the time interval between these two times is preferably smaller than 5 seconds, or even smaller than 2 s or 1 s. The index q is preferably an integer comprised between 1 and 10. In this example, q=5. $\Delta B'_i(t_n)$ is called an instantaneous differential magnetic field because it corresponds to a local variation of the magnetic field between two neighboring times $t_n$ and $t_{n-q}$.

$r_i$ designates the coordinates of a magnetometer $10_i$ in the frame of reference R of the holder.

This substep also includes estimating a centroid position of the reference position using the expression $b(t_{ref})=\Sigma_i k_i(t_{ref})r_i$ (10) where $k_i(t_{ref})$ is a weighting term assigned to the magnetometer $10_i$ at the time $t_{ref}$. For example, $k_i(t_{ref})=\|\Delta B'_i(t_{ref})\|=\|B_i(t_{ref})-B_i(t_{ref\pm q'})\|$, where $\|\Delta B'_i(t_{ref})\|$ is the norm of an instantaneous differential magnetic field such as defined in the preceding paragraph, at said reference time. $t_{ref\pm q'}$, is one or more than one time iterations before or after the reference time $t_{ref}$, such that the time $t_{ref}\pm q'$ corresponds substantially to the reference time $t_{ref}$. The index q' is preferably an integer comprised between 1 and 10, and for example equal to 1.

When the magnetometers are coplanar, this being the case in the described example, each centroid position $b(t_n)$ and $b(t_{ref})$ corresponds to an estimation of the position of the magnet in the plane of the magnetometers at the measurement time and at the reference time, respectively.

Substep 162:
determination of movement vectors. The coordinates of two vectors $V_b(t_n)$ and $V_r(t_n)$ representing movements between the centroids $b(t_{ref})$ and $b(t_n)$ and between the positions $r_{ref}(t_n)$ and $r(t_n)$, respectively are determined.

Substep 164:
validation of the state vector: the state vector $x(t_n)$ is validated by comparing the two vectors $V_b(t_n)$ and $V_r(t_n)$ determined beforehand. For example, the comparison may be carried out by means of a scalar product between these vectors. This scalar product may be normalized by a product of the norm of each of the vectors $V_b(t_n)$ and $V_r(t_n)$. A normalized indicator ind$(t_n)$ is then obtained, the value of which allows the state vector $x(t_n)$ estimated in the iteration to be validated, or not.

$$ind(t_n) = \frac{V_b(t_n) \cdot V_r(t_n)}{\|V_b(t_n)\| \times \|V_r(t_n)\|} \quad (10)$$

where · represents the scalar product operator and × represents a multiplication.

The normalization with the product of the norms allows an indicator ind$(t_n)$, associated with the time $t_n$ to be obtained such that $-1 \leq \text{ind}(t_n) \leq 1$. This indicator represents the cosine of the angle formed by the vectors $V_b(t_n)$ and $V_r(t_n)$. When ind$(t_n) \geq 0.7$, the state vector is $x(t_n)$ is validated. When $\overline{\text{ind}(t_n)} < 0.7$, the state vector is not updated and a new iteration is carried out. When ind$(t_n) < -0.7$, the state vector may be invalidated and corrected as described below, such a value indicating a probable inversion between the estimation of the reference position $r_{ref}(t_n)$ and the position $r(t_n)$ of the magnet at the time $t_n$. Generally, this comparison aims to determine an indicator ind$(t_n)$ that compares the respective orientations of the two movement vectors $V_b(t_n)$ and $V_r(t_n)$, the state vector $x(t_n)$ being validated if these orientations are considered to be sufficiently close.

The principle of the validation step 160 is to compare a precise, but uncertain, estimation of the position of the magnet, given by the state vector, with a less precise, but certain, estimation of this position, given by the centroid calculation.

When the vector is invalidated, it may be corrected by correcting the position of the magnet and the reference position, and the magnetic moments at the measurement time and at the reference time. This correction may be made by simultaneously making the following updates:

$$r_{ref}(t_n) \to r(t_n) \quad (12.1)$$

$$-m_{ref}(t_n) \to m(t_n) \quad (12.2)$$

$$r(t_n) \to r_{ref}(t_n) \quad (12.3)$$

$$-m(t_n) \to m_{ref}(t_n) \quad (12.4).$$

Figure 3B:
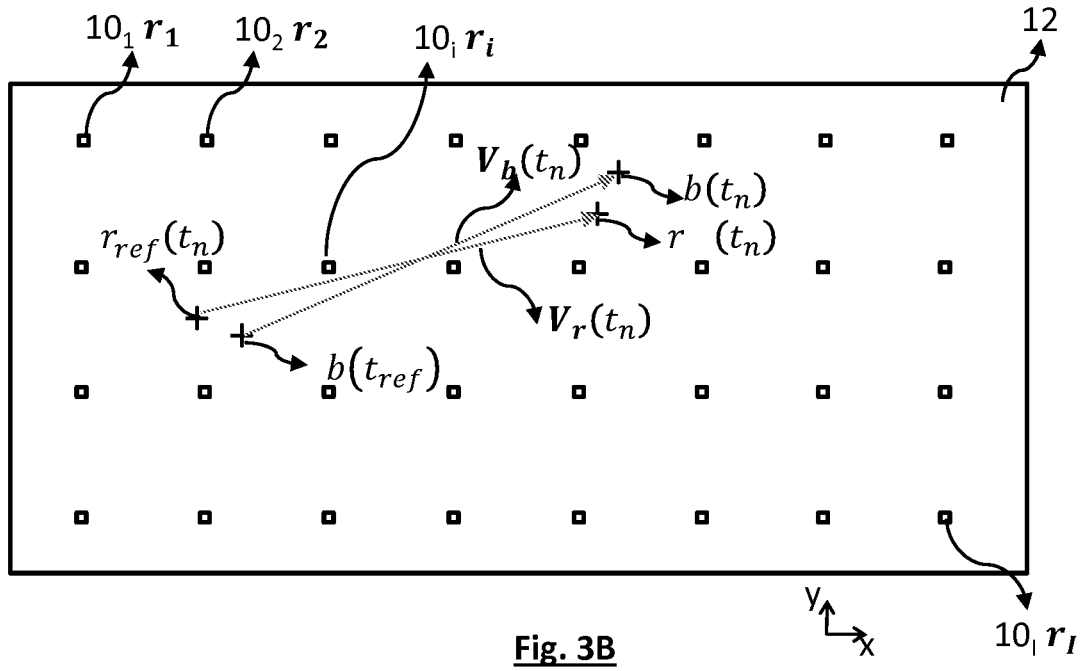
FIGS. 3B and 3C are illustrations of the variant described with reference to FIG. 3A.
Figure 3C:
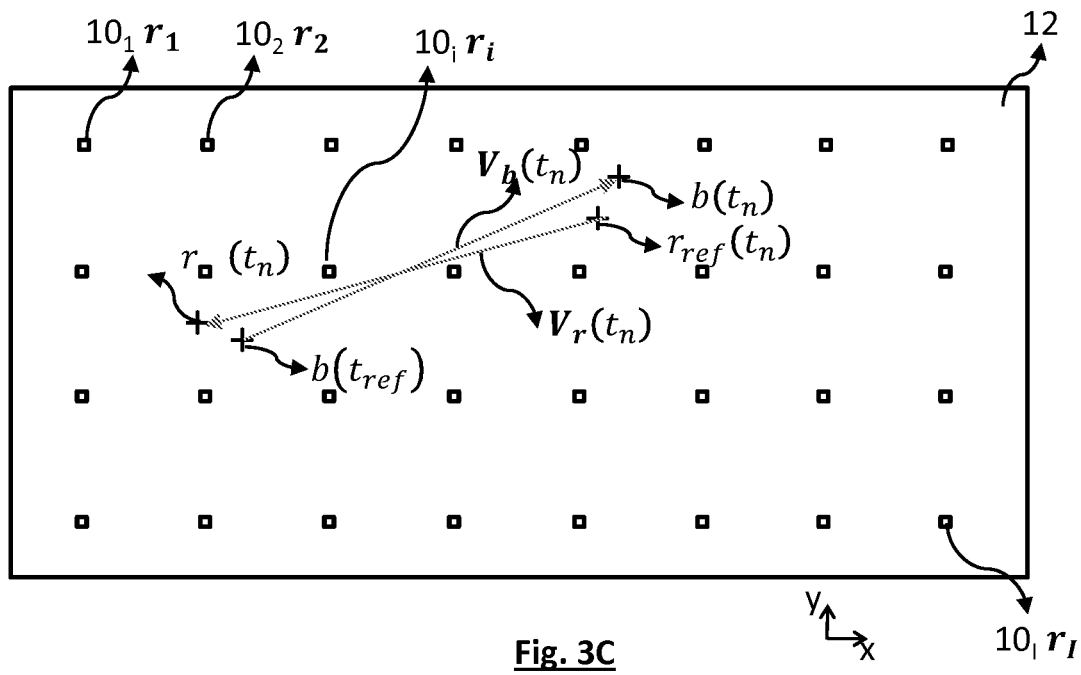

FIGS. 3B and 3C respectively show two configurations, in which the state vector $x(t_n)$ is respectively validated and not validated. In each figure, the magnetometers $10_1, 10_2, \ldots 10_i, \ldots 10_I$, and their associated positions $r_1, r_2, \ldots r_i, \ldots r_I$ have been shown. The centroid positions $b(t_n)$ and $b(t_{ref})$ have also been shown. In this example, the magnetometers are coplanar. The centroid positions $b(t_n)$ and $b(t_{ref})$ are therefore in the plane XY of the magnetometers. The positions $r(t_n)$ and $r_{ref}(t_n)$ are also shown, the latter possibly each having a coordinate, along the Z axis, that is different from the other. FIG. 3B corresponds to the case where the state vector is correctly estimated: the movement vectors $V_b(t_n)$ and $V_r(t_n)$ having orientations that are close to one another and the indicator $ind(t_n)$ being positive, with a value close to 1. In this case, the state vector $x(t_n)$ is validated.

FIG. 3C shows a configuration that is symmetric to the configuration of FIG. 3B, in which the algorithm of step 150 estimates a state vector $x(t_n)$ in which the reference position and the position of the magnet at the current time are inverted. The vectors $V_b(t_n)$ and $V_r(t_n)$ have almost opposite orientations, and the indicator $ind(t_n)$ is negative. In this case, the state vector $x(t_n)$ is not validated. The projection of the position $r(t_n)$ of the magnet is not correctly estimated by the centroid position $b(t_n)$, the estimation of the latter being more robust, but less precise. The state vector is therefore erroneous and must either not be taken into account, or corrected.

Other validation methods may be implemented. For example, a state vector is invalidated when the position $r(t_n)$ is closer to the reference centroid position $b(t_{ref})$ than the centroid position $b(t_n)$ at the measurement time. Another option is to establish an indicator equal to the minimum of:
the norm of the vector $r_{ref}(t_n) - b(t_{ref})$ added to the norm of the vector $r(t_n)-b(t_n)$;
the norm of the vector $r_{ref}(t_n) - b(t_n)$ added to the norm of the vector $r(t_n)-b(t_{ref})$.

In other words, according to this embodiment, step 140 comprises establishing an indicator $ind(t_n)$ such that:

$$ind(t_n) = \min[(\|r_{ref}(t_n)-b(t_{ref})\|+\|r(t_n)-b(t_n)\|);(\|r_{ref}(t_n)-b(t_n)\|+\|r(t_n)-b(t_{ref})\|)] \quad (13).$$

If $ind(t_n) = \|r_{ref}(t_n) - b(t_{ref})\| + \|r(t_n) - b(t_n)\|$, the state vector is validated;
If $ind(t_n) = \|r_{ref}(t_n) - b(t_n)\| + \|r(t_n) - b(t_{ref})\|$, the state vector is not validated.

Whatever the embodiment, in an iteration n, or in each iteration, step 130 may include a substep of selecting magnetometers $10_i$ depending on the intensity of the magnetic field $B_i(t_n)$ measured, by each thereof, at the time $t_n$. This may consist in selecting a group of magnetometers measuring a magnetic field the intensity of which, determined from the norm $\|B_i(t_n)\|$, is located above and/or below preset thresholds. This allows magnetometers that are considered to be saturated (intensity of the magnetic field too high) and/or the measurement of which is not considered to be significant (intensity of the magnetic field too low) to be excluded. The selection thresholds may be established beforehand. In steps 140 and 150 following the selection, the dimensions of the differential vector $\Delta B(t_n)$, of the innovation vector $y(t_n)$, and of the matrices $H(t_n)$, $R(t_n)$, $K(t_n)$, $S(t_n)$ are adapted to the number of magnetometers thus selected. The number of magnetometers selected in an iteration n may vary between the various iterations.

Taking into Account an Ambient Magnetic Field

According to one embodiment, in step 150, the method comprises, at the measurement time $t_n$ taking into account the ambient magnetic field due to the earth's magnetic field or to another source of magnetic field producing a magnetic field that is uniformly over all of the magnetometers. This field is taken into account by determining, in step 152, a vector $\overline{\Delta B(t_n)}$ representing an average differential magnetic field. To obtain this vector, the following are calculated for all of the magnetometers $10_i$:
a vector $\overline{B(t_n)}$ representing an average, which is optionally weighted, of each vector $B_i(t_n)$ measured at the time $t_n$;
a vector $\overline{B(t_{ref})}$ representing an average, which is optionally weighted, of each vector $B_i(t_{ref})$ measured at the reference time $t_{ref}$.

In the case where a weighted average is calculated, high weighting factors (for example 1) may be used for magnetometers the distance of which with respect to the magnet is larger than a threshold distance, a weighting factor of zero being used for the others. As a variant, each weighting factor is representative of the uncertainty in the measurement of a sensor. The higher the measurement uncertainty, the lower the weighting factor.

The vector $\overline{\Delta B(t_n)}$ representing the average differential magnetic field is obtained by subtracting the vector $\overline{B(t_n)}$ and the vector $\overline{B(t_{ref})}$: $\overline{\Delta B(t_n)} = \overline{B(t_n)} - \overline{B(t_{ref})}$.

This vector $\overline{\Delta B(t_n)}$ has a size equal to the number of measurement axes considered in the various magnetometers. In the case of triaxial magnetometers, the size of the vector representing the average differential field is 3×1.

A vector that is called the redimensioned vector $\overline{\overline{\Delta B(t_n)}}$, which is of the same size as the vector $\Delta B(t_n)$ of differential measurements, which was established in step 140 i.e. of size equal to the number of magnetometers in question multiplied by the number of measurement axes, is thus determined. In this example, this size is equal to 32×3=96. The redimensioned average differential magnetic field vector $\overline{\overline{\Delta B(t_n)}}$ is obtained by concatenating the terms of the vector $\overline{\Delta B(t_n)}$ as many times as there are magnetometers in question. The vector $\overline{\overline{\Delta B(t_n)}}$ is of 96×1 size.

Moreover, an average $\overline{h(x(t_n|t_{n-1}))}$ of the estimated differential magnetic field is determined, each term of which average is the average of those terms of the vector $h(x(t_n|t_{n-1}))$ that was determined in substep 152 which corresponds to the same measurement axis. In the case where triaxial magnetometers are considered, the terms, respectively corresponding to each measurement axis, of the vector $h(x(t_n|t_{n-1}))$ are averaged. As described above with regard to the determination of the vector $\overline{\Delta B(t_n)}$, this average may be weighted, in which case the vector $\overline{\Delta B(t_n)}$ and $\overline{h(x(t_n|t_{n-1}))}$ are determined using the same weighting factors. The vector $\overline{h(t_n|t_{n-1})}$ is obtained, which represents, for each measurement axis, the estimated average differential magnetic field, the size of this vector being equal to the number of measurement axes in question, and hence in the present case 3×1. A redimensioned vector $\overline{\overline{h(x(t_n|t_{n-1}))}}$, which represents the estimated average differential magnetic field, is then determined. Just as with the vector $\overline{\overline{\Delta B(t_n)}}$, the vector $\overline{\overline{h(x(t_n|t_{n-1}))}}$ is obtained by concatenating the terms of the vector $\overline{h(x(t_n|t_{n-1}))}$ as many times as there are magnetometers $10_i$ in question. In this example, the vector $\overline{\overline{h(x(t_n|t_{n-1}))}}$ is 96×1 in size.

The innovation is then calculated using the equation (3'):

$$y(t_n) = \Delta B(t_n) - \overline{\overline{\Delta B(t_n)}} - (h(x(t_n|t_{n-1})) - \overline{\overline{h(x(t_n|t_{n-1}))}}) \text{ with} \quad (3')$$

$$\overline{\overline{\Delta B(t_n)}} = \begin{pmatrix} \overline{\Delta B(t_n)} \\ \vdots \\ \overline{\Delta B(t_n)} \end{pmatrix} \text{ and } \overline{\overline{h(x(t_n|t_{n-1}))}} = \begin{pmatrix} \overline{h(x(t_n|t_{n-1}))} \\ \vdots \\ \overline{h(x(t_n|t_{n-1}))} \end{pmatrix}$$

Renewal of the Reference Position.

In the above description, a reference position is taken into account in steps 100 and 110, before the position of the magnet is estimated at the various measurement times. However, in the iterative method, a new reference position may be taken into account, without it being necessary to distance the magnet from the magnetometers. This is moreover a notable advantage of the invention, since each reference position is associated with a measurement of the position of the magnet and with an estimation of the magnetic moment at a reference time. Thus, the reference position may be changed at any moment, without the user having to distance the magnet from the magnetometers. On the contrary, it is sometimes preferable for the reference magnetic field $B_i(t_{ref})$ to be significant for all of the magnetometers of the device. This allows the reference position be renewed without placing constraints on the user, and more frequently. Effects due to drift in the ambient magnetic field are thus limited, and the precision of the location of the magnet is improved. This allows inexpensive magnetometers to be used since potential measurement drift can be tolerated as this measurement drift is compensated for via a more frequent renewal of the reference position.

The renewal may be carried out:
- by comparing the current time $(t_n)$ and the reference time $(t_{ref})$, the reference position being renewed when the time interval between these two times exceeds a preset threshold. It is a question of a regular renewal;
- and/or by analyzing the parameters of the algorithm implemented in step 150, in particular the values of the innovation $y(t_n)$,
- and/or when the magnet is not moving much, i.e. when, during a certain time interval, the distance that it has traveled is smaller than a threshold distance.

The renewal is therefore carried out automatically, without intervention by the user. This increases the user-friendliness and reliability of the device.

During the renewal of the reference position, steps 100 and 110 are carried out, and a new reference position $r_{ref}$ associated with a new reference time $t_{ref}$ are considered in the following iterations. During such a renewal, it is possible, for example, to have at one's disposition an a priori as regards the new reference position $r_{ref}(t_{ref})$, the latter possibly being determined depending on the last position of the magnet, i.e. the position estimated before the renewal of the reference position. This allows the precision of the location to be improved from the first measurement times subsequent to the new reference time.

Establishment of a Plurality of Reference Positions.

Figure 4A:
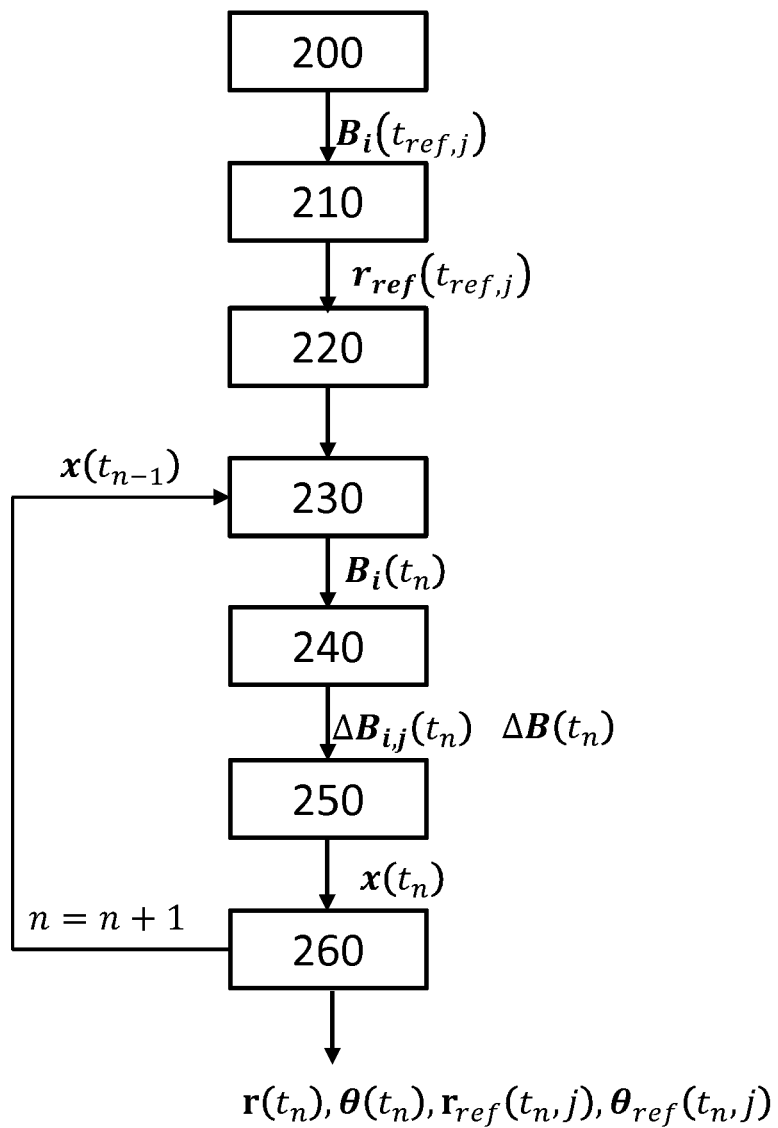
FIG. 4A shows the main steps of another embodiment of the invention.

According to one embodiment, shown in FIG. 4A, a plurality of reference positions $r_{ref,j}$ are taken into account, each being associated with one reference time $t_{ref,j}$, with one reference position $r_{ref}(t_{ref,j})$ at this time, and with one reference magnetic moment $m_{ref,j}$. The state vector then includes, apart from the estimation of the position $r(t_n)$ of the magnet and of its magnetic moment $m_{ref,j}(t_n)$ at the current time, estimations, at this time, of one or more reference positions $r_{ref,j}(t_n)$ and of the associated reference magnetic moment $m_{ref,j}(t_n)$. The index j relates to the reference position in question, with $1 \leq j \leq J$, J being the number of reference positions in question. J may for example be equal to 10. Steps 200 and 210 are analogous to steps 100 and 110 described with reference to FIG. 2A, respectively, except that each of these steps is implemented relative to a reference position j.

Step 230 is analogous to step 130, which was described above, each magnetometer $10_i$ measuring a magnetic field $B_i(t_n)$ at the measurement time $(t_n)$.

In step 240, for each magnetometer $10_i$, a differential magnetic field $\Delta B_{i,j}(t_n)$ is calculated, corresponding to a difference between the magnetic field $B_i(t_n)$ measured by the magnetometer $10_i$ and the magnetic field $B_i(t_{ref,j})$ measured by the magnetometer $10_i$ at the reference time $t_{ref,j}$.

The step 250 of determining the state vector $x(t_n)$ may then be carried out, analogously to step 150, this vector being determined based on the reference position $r_{ref,j}(t_{n-1})$ that is furthest from the position of the magnet determined in the preceding iteration.

According to one embodiment, step 250 may be implemented by considering, in succession, each of the reference positions, so as to estimate what is called an intermediate state vector $x(t_{n,j})$, associated with each reference position j. This intermediate state vector then furthermore comprises the estimation of the position $r(t_{n,j})$ and of the magnetic moment $m(t_{n,j})$ of the magnet at the current time $(t_n)$, an estimation of the $j^{th}$ reference position $r_{ref}(t_{n,j})$ and of the magnetic moment $m_{ref}(t_{n,j})$ associated with the $j^{th}$ reference position. As many intermediate state vectors $x(t_{n,j})$ as there are reference positions in question are then determined in succession. Each intermediate state vector includes an estimation of the position $r(t_{n,j})$ of the magnet, at the measurement time $(t_n)$, this position being referred to as the intermediate position and being established relative to a reference position of index j.

It is then possible to establish a state vector $x(t_n)$ by taking an average of each intermediate state vector $x(t_{n,j})$. The position $r(t_n)$ of the magnet is then estimated by taking an average of the intermediate positions $r(t_{n,j})$. Optionally, this average may be weighted by a weighting factor associated with each intermediate position. The weighting factor may for example increase as the estimation of the reference position $r_{ref}(t_{n,j})$ and the intermediate position $r(t_{n,j})$ that is associated therewith get further apart. It may also be weighted by the inverse of the norm of the innovation vector $y(t_{n,j})$.

The estimation of the position of the magnet may also be such that only the one or more intermediate state vectors $x(t_{n,j})$ the index j of which corresponds to the intermediate position (or positions) $r(t_{n,j})$ that are furthest from the reference positions $r_{ref}(t_{n,j})$ with which they are associated are considered. It is then possible to define a threshold distance, such that an intermediate state vector $x(t_{n,j})$ is taken into account only if the reference position $r_{ref}(t_{n,j})$ with which it is associated is located at a distance larger than the threshold distance of said intermediate position $r(t_{n,j})$. Such a threshold distance may be a few cm, for example 1 or 2 cm. The state vector $x(t_n)$ is then determined depending on the intermediate state vector thus selected, or on an average of the selected intermediate state vectors. Whether or not a reference position $r_{ref}(t_{n,j})$ is taken into account may also depend on the value of a validity indicator $V_j(t_n)$ associated with this reference position. This validity indicator is described below.

According to one embodiment, when a plurality of reference positions are taken into account, the estimation of the position of the magnet considers only certain reference positions, for example reference positions having already been subject to a minimum number $n_{min}$ of iterations. In other words, when a new reference position j–new is selected at a reference time $t_{ref,j-new}$, it is subject to a minimum number $n_{min}$ of iterations, during which iterations the position of the magnet $r_{ref}(t_{n,j-new})$ at the reference time is estimated. If this minimum number of iterations is not reached, the estimation of the position $r(t_n)$ of the magnet does not take this new reference position into consideration. This minimum number of iterations allows the estimation of the position $r_{ref}(t_{n,j-new})$ of the magnet at the reference time to be refined for the newly selected reference. The latter is taken into account to estimate the position $r(t_{n,j-new})$ of the magnet when the reference position $r(t_{n,j-new})$ is estimated with a sufficient precision. The minimum number of iterations may be preset, or depend on the variation between two successive estimations $r_{ref}(t_{n,j-new})$, $r_{ref}(t_{n+1,j-new})$ of the position of the magnet at the reference time $t_{ref,j-new}$, the latter being considered to be small when the relative deviation between two successive estimations is sufficiently small. This amounts to considering a "heating time" in which the estimation of a newly taken into account reference position is refined before using it in the estimation of the position of the magnet.

Figure 4B:
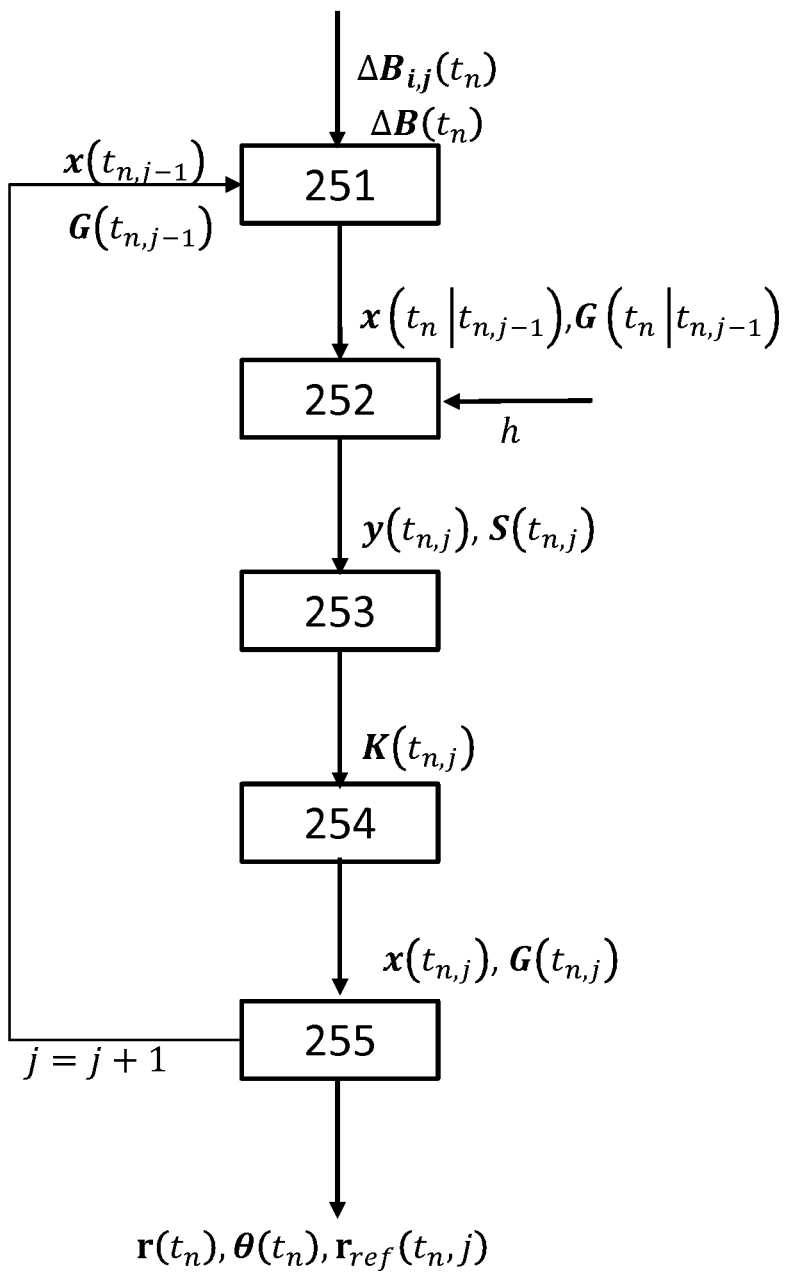
FIG. 4B shows the details of one of the steps of this other embodiment.

According to one variant, shown in FIG. 4B, step 250 is implemented iteratively, each reference position being considered, in succession, in each iteration.

Thus, in a first iteration (j=1), a state vector $x(t_{n,j=1})$ including an intermediate estimation of the position $r(t_{n,j=1})$ and of the magnetic moment $m(t_{n,j=1})$ and an estimation of the 1st reference position $r_{ref}(t_{n,j=1})$ and of the magnetic moment $m(t_{n,j})$ of the magnet at the 1st reference time $t_{0,j=1}$ is determined. The intermediate state vector $x(t_{n,j})$ and the covariance matrix of the error $G(t_{n,j})$, both obtained in an iteration j, are then implemented in the step 251 of estimating the state vector of the following iteration (j=j+1), using the expressions:

$$x(t_{n,j}|t_{n,j-1}) = x(t_{n,j-1}) \quad (1')$$

and $$G(t_n|t_{n,j-1}) = F(t_n)G(t_{n,j-1})F^T(t_n) + Q(t_n) \quad (2').$$

The algorithm continues such as described above, so as to determine:
- an innovation vector $y(t_{n,j})$ and a covariance matrix $S(t_{n,j})$ of the innovation (step 252);
- a gain matrix $K(t_{n,j})$ (step 253);
- the estimation of an intermediate state vector $x(t_{n,j})$ and of the associated covariance matrix $G(t_{n,j})$ (step 254) the latter vector and matrix being used in the following iteration (step 255 then step 251).

In the Jth iteration, the algorithm generates a state vector $x(t_n)$, corresponding to the intermediate state vector $x(t_{n,j=J})$ of the iteration J. This vector is preferably subject to a validation (step 260), similarly to step 160 described above, then the process is reiterated at a measurement time $t_{n+1}$. Thus, an estimation of the position of the magnet $r(t_n)$ and of its magnetic moment $m(t_n)$ is obtained, on the basis of which the orientation $\theta(t_n)$ may be calculated. An up-to-date version of each reference position $r_{ref}(t_n)$ is also obtained.

According to one variant, the state vector $x(t_n)$ comprises all of the reference positions, which serve as a basis for measurement of a plurality of differential magnetic fields. These reference positions are refined over the course of the iterations.

According to one variant, a plurality of magnets are moved, and the state vector comprises an estimation of a position of each thereof and at least one estimation of the reference position. The state vector may also include an estimation of one or more components of the magnetic moment of each magnet.

When a plurality of reference positions are taken into account in the algorithm, one or more than one, of these reference positions may be infinity, or a magnetic moment of zero. This corresponds to the case where the reference position is located outside of the distance range covered by the magnetometers. The reference magnetic field $B_i(t_{ref})$ produced on each magnetometer $10_i$ of the array is then negligible.

In each of the embodiments described above, to each reference position may be assigned a validity indicator $V_j(t_n)$, representing the validity of a jth reference position at the current time $t_n$. This validity indicator may in particular be determined depending:
- on a comparison between the current time $(t_n)$ and the reference time $(t_{ref,j})$ associated with the reference position of index j, the reference position being renewed when the time interval between these two times exceeds a preset threshold, this allowing the reference positions to be updated regularly;
- and/or an analysis of the parameters of the algorithm implemented in step 150, in particular the values of the innovation $y(t_{n,j})$,
- and/or the obtainment of a distribution of the spatially distributed reference positions $r_{ref}(t_{n,j})$. Thus, a reference position is replaced if a new reference position is located in its vicinity, i.e. at a distance smaller than a pre-established distance. This allows the spatial distribution of the reference positions to be optimized.

When the validity indicator indicates that a reference position is no longer valid, the latter is replaced in the steps 200 and 210 shown in FIG. 4A or in the steps 100 to 110 described with reference to FIG. 2A.

Fusion of Reference Positions.

According to one variant, applicable to embodiments based on the use of a plurality of references, a plurality of reference positions are used and a new reference position based on a fusion of said reference positions is determined. For example, a jth reference position and a j+1th reference position are known.

At a current time the current time $(t_n)$ the ambient magnetic fields $\bar{B}_i^{amb}(t_{ref,j})$ and $\bar{B}_i^{amb}(t_{ref,j+1})$ are estimated for each magnetometer 10; at the reference times $(t_{ref,j})$ and $(t_{ref,j+1})$, respectively. By ambient magnetic field, what is meant is a magnetic field due to the environment of a sensor and to the drift of the sensor: $B_i^{amb} = B^{env} + B_i^{offset}$, $B^{env}$ and $B_i^{offset}$ having been defined above.

$\bar{B}_i^{amb}(t_{ref,j}) = B_i(t_{ref}) - \hat{B}_i(t_{ref,j}; t_n)$, $\hat{B}_i(r_{ref}(t_{n,j}))$ corresponding to an estimation of the magnetic field produced by the magnet placed in the jth reference position $r_{ref}(t_{n,j})$ such as estimated at the time $t_n$;

$\bar{B}_i^{amb}(t_{ref,j+1}) = B_i(t_{ref}) - \hat{B}_i(r_{ref}(t_{n,j+1}))$, $\hat{B}_i(r_{ref}(t_{n,j+1}))$ corresponding to an estimation of the magnetic field produced by the magnet placed in the j+1th reference position $r_{ref}(t_{n,j+1})$ such as estimated at the time $t_n$.

It is possible to define a new reference j', based on the estimations $\bar{B}_i^{amb}(t_{ref,j})$ and $\bar{B}_i^{amb}(t_{ref,j+1})$ and for example taking the form of a linear combination such as $$\bar{B}_i^{amb}(t_{ref,j'}) = \frac{\bar{B}_i^{amb}(t_{ref,j}) + \bar{B}_i^{amb}(t_{ref,j+1})}{2}.$$

This reference j', which is what is called a fused reference, corresponds to a linear combination of ambient magnetic fields, in the absence of a magnet. Thus, the reference position $r(t_{ref,j})$ is assigned to a reference moment $m_{ref}$ of zero and/or to a position $r_{ref}$ at infinity.

Although described with reference to an array of coplanar magnetometers, the invention will possibly be implemented using magnetometers arranged in any sort of array, for example an array describing a curvilinear surface. Preferably, whatever the embodiment, the magnetometers are rigidly connected to one another, for example by way of the holder 12.

Moreover, the method described in this description is based on the use of an extended Kalman filter. The invention covers other embodiments implementing estimators allowing the inversion of a direct model, and in particular any recursive estimator known to those skilled in the art.

The invention claimed is:

1. A method for estimating a position of a magnet that is being moved relative to a magnetometer array comprising a plurality of magnetometers, each magnetometer being configured to measure a magnetic field generated by said magnet along at least one measurement axis, said method comprising
   a) measuring, with each magnetometer, a reference magnetic field at a reference time,
   b) assigning a reference position to said magnet at said reference time, said reference position being assigned to an arbitrary position or to an estimate of a position of said magnet at said reference time,
   c) measuring a magnetic field generated by said magnet with each magnetometer, at a measurement time after said reference time,
   d) calculating a differential magnetic field representing a difference, for each magnetometer, between said magnetic field measured in c) and said reference magnetic field measured in a),
   e) on the basis of each differential magnetic field and of an estimate of said reference position, estimating a position of said magnet at said measurement time, said estimate being carried out by a recursive estimator, said reference position of said magnet being, in a first iteration, the position that was assigned to said magnet at said reference time, and
   reiterating c) to e) on the basis of said estimate obtained in e), while incrementing said measurement time.

2. The method of claim 1, wherein, in e), said position of said magnet is estimated based on
   an estimate of said magnet's position at a time that precedes said measurement time and
   an estimate of said reference position, said estimate of said reference position being carried out a time that precedes said measurement time,
   wherein e) further comprises updating, at said measurement time, said estimate of said reference position.

3. The method of claim 1, further comprising, following e),
   e') validating said respective estimates of said position of said magnet at said measurement time and of said reference position, wherein e') includes the following sub steps:
   i) determining a movement of said magnet between said measurement time and said reference time, a position of each magnetometer being weighted, at each of these times, by a weighting factor that depends on a modulus of the magnetic field measured by said magnetometer at each time,
   ii) comparing said movement determined in i) with a movement calculated using said estimates, at said measurement time, of said position of said magnet and of said reference position.

4. The method of claim 3, wherein i) further comprises, determining, for each magnetometer, an instantaneous differential magnetic field, which represents a variation between the magnetic field measured at a first time and the magnetic field measured at a second time, the second time neighboring the first time, the determination being carried out by considering, successively, a first time corresponding to the measurement time and to the reference time, so as to obtain an instantaneous differential magnetic field at each of said times, determining each weighting factor at said measurement time and at said reference time, respectively, based on a modulus of said instantaneous differential magnetic field at said measurement time and at said reference time, respectively.

5. The method of claim 1, further comprising repeatedly executing a) and b), thereby obtaining plural reference positions, wherein each reference position is associated with
   a reference time,
   a position assigned to said magnet at said reference time, and
   a reference magnetic field measured by each magnetometer at said reference time, and
   wherein d) comprises calculating at least one differential magnetic field from at least one reference magnetic field.

6. The method of claim 5, wherein a validity indicator is associated with each of said reference positions, and wherein, in d) and e), said reference position is taken into account at said measurement time depending on said validity indicator.

7. The method of claim 5, further comprising repeatedly executing a) and b) for as long as the number of reference positions is less than a preset number of reference positions.

8. The method of claim 5, wherein d) further comprises calculating a plurality of differential magnetic fields, each representing a difference, for each magnetometer, between a magnetic field measured in c) and each reference magnetic field.

9. The method of claim 8, wherein
   e) further comprises estimating a plurality of intermediate estimates of said position of said magnet at said measurement time, each intermediate estimate being based on a reference position that differs from one to the next, the position of the magnet at the measurement time being determined depending on said intermediate estimates, and wherein
   e) further comprises updating said estimate of each reference position at said measurement time.

10. The method of claim 9, wherein e) further comprises estimating a position of said magnet at said measurement time based on
    an average of intermediate estimates, and/or
    by considering a reference position that is the furthest away or a reference position that is located beyond a preset distance from said plurality of intermediate estimates
    or a validity indicator being associated with each reference position, on the basis of a reference position that is selected depending on the validity indicator that is associated therewith,
    or by considering each reference position in succession.

11. The method of claim 1, wherein e) comprises, apart from estimating the position of the magnet at the measurement time, estimating an orientation of said magnet at said measurement time.

12. The method of claim 1, wherein e) further comprises estimating components of a magnetic moment of said magnet at said measurement time.

13. The method of claim 12, wherein, in e), the components of said magnetic moment of said magnet are constrained such that a modulus of said magnetic field of said magnet corresponds to a preset value or a range of values.

14. The method of claim 1, wherein
    d) comprises determining, at said measurement time, an average differential magnetic field that represents a difference between an average of magnetic fields measured by each magnetometer at said measurement time and at said reference time, respectively and wherein e) comprises taking into account said average differential magnetic field by subtracting said average differential magnetic field from said differential magnetic field.

15. The method of claim 14, wherein said e) further comprises estimating said differential magnetic field measured, at said measurement time, by each magnetometer, and determining an average of each differential magnetic field, and taking into account an average of said estimates of each differential magnetic field measured by each magnetometer, said terms of which are subtracted from said estimate of said differential magnetic field measured, at said measurement time, by each magnetometer.

16. The method of claim 1, further comprising using an extended Kalman filter to execute e).

17. The method of claim 1, wherein e) comprises determining a state vector relating to said measurement time, said state vector being determined depending on said state vector at a time preceding said measurement time, said time preceding said measurement being said reference time or a time corresponding to a preceding iteration of c) to e), said state vector including said position of said magnet at said measurement time.

18. The method of claim 17, wherein e) comprises estimating a state vector at said measurement time on the basis of a state vector relating to a time preceding the measurement and updating a state vector at said measurement time, based at least in part on a differential magnetic field determined in d).

19. An apparatus for locating a movable magnet, said magnet being configured to be moved relative to a magnetometer array, each magnetometer being configured to deliver, at various measurement times, a measurement of a magnetic field produced by said magnet along at least one measurement axis, wherein said apparatus comprises a processor configured to receive, at each measurement time, measurements delivered by each magnetometer and to implement the method of claim 1 so as to iteratively estimate a position of said magnet at each measurement time.

20. A manufacture comprising a tangible and non-transitory data-storage medium containing instructions for causing a processor to execute b) to e) of the method of claim 1 on the basis of measurements provided by said magnetometer array.

* * * * *